US011070091B2

United States Patent
Bhandarkar et al.

(10) Patent No.: US 11,070,091 B2
(45) Date of Patent: Jul. 20, 2021

(54) WIRELESS POWER TRANSFER BASED ON TRANSMITTER COIL VOLTAGE SENSING

(71) Applicant: Microchip Technology Incorporated, Chandler, AZ (US)

(72) Inventors: Santosh Manjunath Bhandarkar, Chandler, AZ (US); Alex Dumais, Boise, ID (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 25 days.

(21) Appl. No.: 16/730,264

(22) Filed: Dec. 30, 2019

(65) Prior Publication Data

US 2021/0099016 A1    Apr. 1, 2021

Related U.S. Application Data

(60) Provisional application No. 62/906,332, filed on Sep. 26, 2019.

(51) Int. Cl.
| | |
|---|---|
| *H02J 50/12* | (2016.01) |
| *G01R 19/25* | (2006.01) |
| *H02J 50/80* | (2016.01) |

(52) U.S. Cl.
CPC .......... *H02J 50/12* (2016.02); *G01R 19/2509* (2013.01); *H02J 50/80* (2016.02)

(58) Field of Classification Search
None
See application file for complete search history.

(56) References Cited

U.S. PATENT DOCUMENTS

| | | | |
|---|---|---|---|
| 2014/0266019 A1 | 9/2014 | Pigott et al. | 320/108 |
| 2015/0115727 A1* | 4/2015 | Carobolante | H02J 50/40 |
| | | | 307/104 |
| 2016/0285311 A1* | 9/2016 | Masumoto | H02J 50/80 |
| 2017/0149286 A1* | 5/2017 | Joye | H02J 7/045 |
| 2017/0346344 A1 | 11/2017 | Uchimoto | |
| 2018/0262049 A1* | 9/2018 | Ikefuji | H03F 3/2176 |

(Continued)

OTHER PUBLICATIONS

International Search Report and Written Opinion, Application No. PCT/US2020/024376, 19 pages, dated Jun. 9, 2020.

(Continued)

*Primary Examiner* — Lincoln D Donovan
*Assistant Examiner* — Khareem E Almo
(74) *Attorney, Agent, or Firm* — Slayden Grubert Beard PLLC

(57) ABSTRACT

In a wireless power transfer system for supplying power to a wireless device, e.g., charging a battery, wireless power transmitter coil voltage is used in place of coil current for communication and power control reference. The transmitter coil voltage waveforms provide phase information, with reference to the pulse width modulation (PWM) waveforms, that can be used to demodulate digital packet communication from a wireless power receiver used to provide a voltage to a device. The DC voltage amplitude of the wireless power transmitter coil is used for controlling the power injected to the wireless power receiver coil, while the phase of the transmitter coil voltage PWM signal is used for demodulation of signal packets from the wireless power receiver to control the transmitter coil voltage and thereby wireless power transfer to the power receiver.

21 Claims, 10 Drawing Sheets

(56) References Cited

U.S. PATENT DOCUMENTS

| | | | | |
|---|---|---|---|---|
| 2018/0316226 A1* | 11/2018 | Jung | ............... | H02J 50/40 |
| 2019/0148980 A1* | 5/2019 | Kim | ............... | H02J 50/05 |
| | | | | 307/104 |
| 2019/0319674 A1* | 10/2019 | Du | ............... | H02J 3/385 |

OTHER PUBLICATIONS

"Introduction to the Power Class 0 Specification—Version 1.2.3," Wireless Power Consortium, URL: https://www.wirelesspowerconsortium.com/data/downloadables/2/2/0/5/qi-wireless-power-specification-non-confidential.zip, 16 pages dated Feb. 2017.

"The Qi Wireless Power Transfer System, Power Class 0 Specification—Parts 1 and 2: Interface Definitions—Version 1.2.3," Wireless Power Consortium, URL: https://www.wirelesspowerconsortium.com/data/downloadables/2/2/0/5/qi-wireless-power-specification-non-confidential.zip, 165 pages, dated Feb. 2017.

"The Qi Wireless Power Transfer System, Power Class 0 Specification—Part 4: Reference Designs—Version 1.2.3," Wireless Power Consortium, URL: https://www.wirelesspowerconsortium.com/data/downloadables/2/2/0/5/qi-wireless-power- specification-non-confidential.zip, 336 pages, dated Feb. 2017.

\* cited by examiner

Wireless Power Control Block (Transmitter)

WIRELESS POWER TRANSFER BASED ON TRANSMITTER COIL VOLTAGE SENSING

RELATED PATENT APPLICATION

This application claims priority to commonly owned U.S. Provisional Patent Application Ser. No. 62/906,332; filed Sep. 26, 2019; entitled "Wireless Power Transfer Based on Transmitter Coil Voltage Sensing," and is hereby incorporated by reference herein for all purposes.

TECHNICAL FIELD

The present disclosure relates to wireless power transfer, and, more specially, to wireless power transfer based on transmitter coil voltage sensing.

BACKGROUND

Wireless power transfer techniques are widely used to transfer power from one consumer device to another in a wide range of applications, e.g., cell phones, tablet computers, battery operated instruments and tools, and the like. Qi is an open interface standard that defines wireless power transfer using inductive charging over distances of up to 4 centimeters (1.6 inches) and was developed by the Wireless Power Consortium (WPC) of Piscataway, N.J. Qi is the most widely adopted wireless charging standard and it has proliferated into nearly all consumer cell phone brands.

A Qi wireless power transfer system consists of a transmitter and a receiver magnetically coupled together with inductive coils. The transmitter and receiver use resonant circuits formed by the coupled coils and respective capacitors. This is required for efficient transfer of power therebetween. The transmitter controls the power transferred to the receiver based on a feedback signal received by the transmitter from the receiver. The receiver communicates with the transmitter using bi-phase amplitude modulation, while the transmitter communicates with the receiver using frequency modulation (FM). The receiver communicates a power level required by sending a digital packet comprising an 8-bit signed number. The transmitter uses its coil current amplitude measured before the packet arrival as a reference and uses the information therefrom to either increase or decrease the power level to the transmitter charging coil that is magnetically coupled to the receiver charging coil of the receiver charging circuit.

The digital packet communication from the receiver to the transmitter is done in-band by altering the electrical conditions of the coil at the receiver end. The change in the state can be implemented using a switching resistance or a switching capacitance at the receiver that affects the receiver coil loading or resonant frequency. The data rate of change is typically between 1 kHz to 2 kHz to transmit a stream of bits from the receiver to the transmitter. The change in the capacitance or resistance of the receiver coil causes a change in the transmitter coil current. The transmitter uses the coil current as a reference to control the power transferred to the receiver in accordance with the Qi specification. Also, the phase of the transmitter coil current is used to detect the communication packets reliably under severe misalignment conditions of the transmitter and receiver. The feedback signal from the receiver is seen at the transmitter as an amplitude change in the order of a few milliamps to hundreds of milliamps depending upon the alignment of the receiver coil with the transmitter coil, input voltage, load conditions, and distance between transmit and receive coils, without limitation. However, this requires current sensing circuitry such as a current transformer (CT) to detect the current in the transmitter coil. Current sensing is not preferred in automotive applications having stringent vibration requirements. In addition, the cost of current sensing circuitry is significant because enough current carrying capacity must be provided for the maximum expected value of transmit coil current.

One of the key challenges in wireless power transfer is to extract the demodulated signal under misaligned conditions between the transmitter and receiver coils as the signals received by the transmitter have a meager amplitude causing dead spots in data transmission and the signals may be significantly distorted. This may lead to shutdown of the transmitter power delivery. Further, the transmitter is expected to successfully work with different receivers having widely varying electrical characteristics.

SUMMARY

Therefore, what is needed is a robust means of data reception by a transmitter in a wireless power delivery system, and to prevent dead spots in the data transmission as this would lead to shutdown of the transmitter power delivery.

According to an embodiment, a system for wireless power transfer based on transmitter coil voltage sensing may comprise: a wireless power transmitter that may comprise a DC-to-AC power inverter, wherein an input of the power inverter may be adapted for coupling to a DC power source, a transmitter tuned circuit may comprise a series connected capacitor and a transmitter power coil, wherein the series connected capacitor and transmitter power coil may be coupled to an output of the DC-to-AC power inverter, a circuit for sampling voltage on the transmitter power coil, whereby amplitude and phase of the voltage may be determined; and a wireless power receiver may comprise an AC-to-DC power converter, a receiver tuned circuit may comprise a receiver power coil and at least one capacitor, wherein the receiver tuned circuit may be coupled to an AC input of the AC-to-DC power converter, a voltage control circuit coupled to a DC output of the AC-to-DC power converter and providing a DC voltage to a load, and a data communications circuit for modulating voltage control data onto the receiver tuned circuit; wherein the receiver power coil may be inductively coupled to the transmitter power coil, receives power therefrom and transmits modulated voltage control data thereto for controlling the voltage amplitude on the transmitter power coil.

According to a further embodiment, the data communications circuit may modulate the voltage control data onto the receiver tuned circuit by changing current drawn by the load. According to a further embodiment, the data communications circuit may modulate the voltage control data onto the receiver tuned circuit by changing the receiver tuned circuit resonant frequency. According to a further embodiment, voltage control data may be demodulated by comparing the phase of the voltage on the transmitter power coil with a pulse width modulation (PWM) signal from the output of the DC-to-AC power inverter. According to a further embodiment, the wireless power transmitter may comprise: a positive voltage detector coupled at a node between the series connected capacitor and transmitter power coil and providing a positive voltage therefrom, an analog-to-digital converter (ADC) having an analog input coupled to an output of the positive voltage detector, and a microcontroller having a digital input coupled to the ADC and an output coupled to and controlling the DC-to-AC power inverter, wherein the microcontroller monitors the positive voltage from the positive voltage detector and controls the AC voltage from the DC-to-AC power inverter, wherein the positive voltage may comprise a positive voltage waveform from the DC-to-AC power inverter and the modulated voltage control data from the wireless power receiver. According to a further embodiment, the wireless power receiver may comprise: a circuit for providing an error value from a comparison between the DC output voltage from the AC-to-DC power converter and a reference voltage; an N-bit digitizer for digitizing the error value to a digital error value; and a serializer for converting the digital error value into a serial data word and coupling the serial data word to the data communications circuit for transmission as the modulated voltage control data to the wireless power transmitter.

According to a further embodiment, the demodulation of the voltage control data may comprise: a de-serializer for converting the serial data work back to the digital error value; a digital divider for dividing the digital error value (e) by 128; an adder for adding one (1) to e/128; a first sampler for sampling the voltage on the transmitter power coil at a delay time instance i to produce a voltage reference, Vref; a multiplier for multiplying Vref with 1+e/128 to produce a voltage reference error value, Vreferr; a second sampler for sampling the voltage on the transmitter power coil at a delay time instance j to produce a coil voltage, Vcoil; a subtractor for subtracting Vcoil from Vreferr to produce an error voltage, Verr; and a proportional-integral-derivative (PID) compensator having an input coupled to the subtractor and receiving the error voltage, Verr. According to a further embodiment, may comprise a gain block to scale an output of the PID compensator. According to a further embodiment, the first sampler may take at least one sample at delay time instance i, wherein i may be a positive integer value. According to a further embodiment, i may be from 1 to 20 for every voltage control data received. According to a further embodiment, the second sampler may take at least one sample at delay time instance j, wherein j may be a positive integer value. According to a further embodiment, j may be from 1 to 20 for every voltage control data received. According to a further embodiment, the voltage reference, Vref, may be an average of i samples per voltage control data received. According to a further embodiment, the coil voltage, Vcoil, may be an average of j samples per voltage control data received. According to a further embodiment, N may be equal to eight (8). According to a further embodiment, the DC-to-AC power inverter may be a metal oxide semiconductor field effect transistor (MOSFET) H-bridge inverter.

According to another embodiment, a method for wireless power transfer based on transmitter coil voltage sensing may comprise the steps of: generating an alternating current (AC) signal from a DC power source and coupling the AC signal to a transmitter tuned circuit may comprise a series connected capacitor and a transmitter power coil; inductively coupling the AC signal from the transmitter tuned circuit to a receiver tuned circuit may comprise a receiver power coil and at least one capacitor; generating a DC voltage with an AC-to-DC power converter coupled to the receiver tuned circuit, wherein the receiver tuned circuit may be coupled to an AC input of the AC-to-DC power converter; supplying DC voltage from the AC-to-DC power converter to a load; modulating voltage control data onto the receiver tuned circuit whereby a voltage on the transmitter power coil may change according to the voltage control data modulation; sampling the voltage on the transmitter power coil, whereby amplitude and phase of the voltage may be determined; demodulating the voltage control data from the phase of the sampled voltage on the transmitter power coil; and controlling the amplitude of the voltage on the transmitter power coil from the demodulated voltage control data.

According to a further embodiment of the method, the step of modulating voltage control data onto the receiver tuned circuit may comprise the step of changing current drawn by the load with the voltage control data. According to a further embodiment of the method, the step of modulating voltage control data onto the receiver tuned circuit may comprise the step of changing the receiver tuned circuit resonant frequency with the voltage control data. According to a further embodiment of the method, the modulating voltage control data may comprise serial digital data. According to a further embodiment of the method, the step of demodulating the voltage control data from the phase of the sampled voltage may comprise the step of comparing the sampled voltage to a pulse width modulation (PWM) signal of the generated AC signal.

BRIEF DESCRIPTION OF THE DRAWINGS

A more complete understanding of the present disclosure may be acquired by referring to the following description taken in conjunction with the accompanying drawings wherein.

Figure 1:
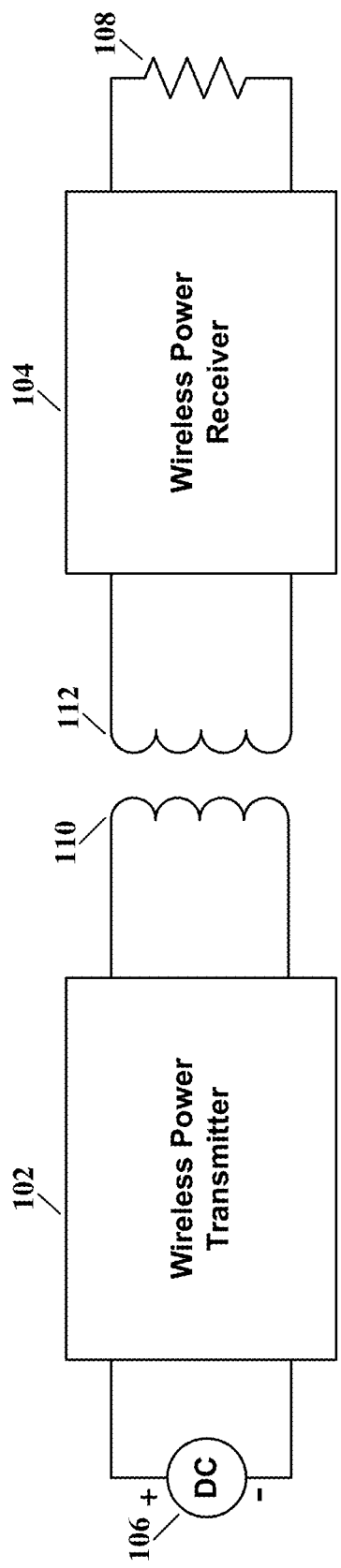
FIG. 1 illustrates a schematic block diagram of a wireless power system, according to the teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

According to the teachings of this disclosure, transmitter coil voltage may be used in place of transmitter coil current for communication and power control reference. The amplitude of the coil voltage may be used as a reference to control the power transmitted. Further, the transmitter coil voltage waveforms exhibit phase information with reference to the pulse width modulation (PWM) waveforms, which can be used to demodulate the digital packet communication from the receiver. A voltage divider, in combination with an analog-to-digital converter (ADC), may be used to sense the transmitter coil voltage thereby providing a low-cost solution. The transmitter coil voltage may be sampled in reference to the PWM waveform to extract the phase information as well as the DC voltage amplitude. Oversampling/averaging may be used to provide an effective and low-cost implementation. The DC voltage amplitude may be used for controlling the power injected to the receiver, while the phase may be used for demodulation of the signal packets from the receiver.

Advantages of the present invention are: 1) reduced hardware, as compared to the prior art, is required for achieving robust wireless charging control under all conditions of load and input voltage, 2) reduced hardware, as compared to the prior art, is required for achieving robust demodulation under all conditions including misalignment of transmitter and receiver coils, and 3) a compact solution is achieved due to the reduced component requirements.

Referring now to the drawings, the details of example embodiments are schematically illustrated. Like elements in the drawings will be represented by like numbers, and similar elements will be represented by like numbers with a different lower-case letter suffix.

Referring to FIG. 1, depicted is a schematic block diagram of a wireless power system, according to the teachings of this disclosure. The wireless power system may comprise a wireless power transmitter 102, a wireless power receiver 104, a DC voltage source 106, a power load 108 and a set of magnetically coupled coils 110 and 112. The wireless power transmitter 102 is coupled to and powered by the DC voltage source 106, while the wireless power receiver 104 is coupled to the load 108. Power is transferred from the wireless power transmitter 102 to the wireless power receiver 104 through the set of magnetically coupled coils 110 and 112. The power transmission is efficient when the coils 110, 112 are placed proximate to each other and have optimal alignment therebetween. There is no physical nor direct electrical connection between the coil 110 coupled to the wireless power transmitter 102 and the coil 112 coupled to the wireless power receiver 104. The wireless power transmitter 102 controls the power transferred to the coil 112 of the wireless power receiver 104 by controlling the input voltage, frequency, phase and/or duty cycle of the signal applied to the coil 110. The coils 110 and 112 comprise inductors each having an inductance value.

Figure 2:
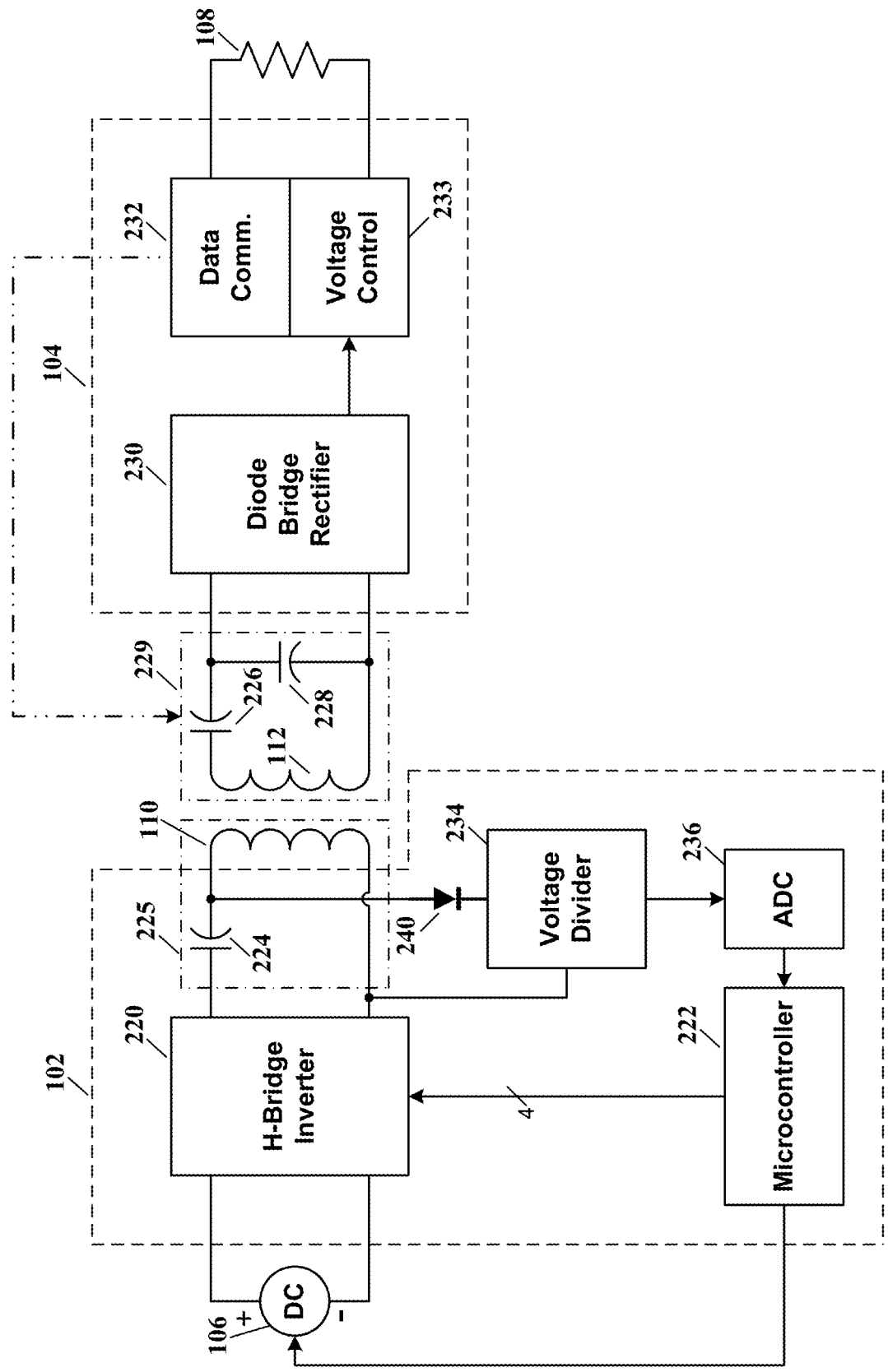
FIG. 2 illustrates a schematic block diagram of a wireless power system, according to a specific example embodiment of this disclosure.

Referring now to FIG. 2, depicted is a schematic block diagram of a wireless power system, according to a specific example embodiment of this disclosure. The wireless power transmitter 102 may comprise a DC-to-AC power inverter 220, e.g., metal oxide semiconductor field effect transistor (MOSFET) H-bridge inverter 220, coupled to and controlled by a microcontroller 222. A transmitter tuned circuit 225 (resonant) comprising a capacitor 224 and the coil 110, in series, may be connected across the output of the H-bridge inverter 220. The input to the H-bridge inverter 220 may come directly from the DC voltage source 106 or from the output of a four-switch buck boost converter (FSBBC) (not shown), which may provide the input voltage to the H-bridge inverter 220. The voltage across the coil 110 may be divided down with a voltage divider 234, e.g., series connected resistors, and optionally through a diode 240 used as a positive voltage detector. The voltage from the voltage divider 234 may be converted into a digital value with an analog-to-digital converter (ADC) 236 having a digital output coupled to the microcontroller 222. The ADC 236 may be integral with the microcontroller 222.

The wireless power receiver 104 is coupled to a receiver tuned (resonant) circuit 229 comprising the coil 112 and the capacitors 226 and 228, wherein the capacitor 226 is in series with the coil 112 and capacitor 228 is in parallel with the coupling to wireless power receiver 104. The output voltage from the receiver tuned circuit 229 may be rectified by an AC-to-DC power converter 230, e.g., diode bridge rectifier 230. The diode bridge rectifier 230 output may be coupled to a voltage control circuit 233 and may comprise a buck converter or a low power dropout (LDO) regulator that provides a fixed voltage to the output load 108. A data communications (modulator) circuit 232 may modulate the current drawn from the diode bridge rectifier 230, or the receiver tuned circuit 229 (detuning circuit not shown) for modulating the resonant frequency thereof. Either data communications modulation method may be detected (demodulated) by the wireless power transmitter 102.

There are several ways to control the power transmitted to the wireless power receiver 104. The power transfer may be controlled by a single variable at a given time. For example, but not limited to, the frequency, the duty cycle and/or the phase of the H-bridge inverter 220 may be varied to control the power transferred. For example, if the power transfer range is large, then more than one of these variables may be used for control. For instance, if frequency hits a limit, then duty cycle may be used for control. Phase control is control of the overlap time (phase) between the two legs of the H-bridge inverter 220. A left leg of the H-bridge inverter 220 may be controlled by a complementary PWM pair, while a right leg PWM pair of the H-bridge inverter 220 may be phase shifted in respect to the left leg. If the phase shift is zero, no power is delivered, while a 180-degree phase shift transfers maximum power.

The voltage from the DC voltage source 106 may be controlled, e.g., by the microcontroller 222, to regulate the power transferred but may need an additional power stage (not shown) between the DC voltage source 106 and the H-bridge inverter 220. The use of an additional controllable power stage may result in a fixed frequency operation, since there may be no need to vary the frequency. The frequency for a Qi standard MP-A9 type of wireless transmitter with voltage control uses a fixed frequency of 125 kHz.

Figure 3:
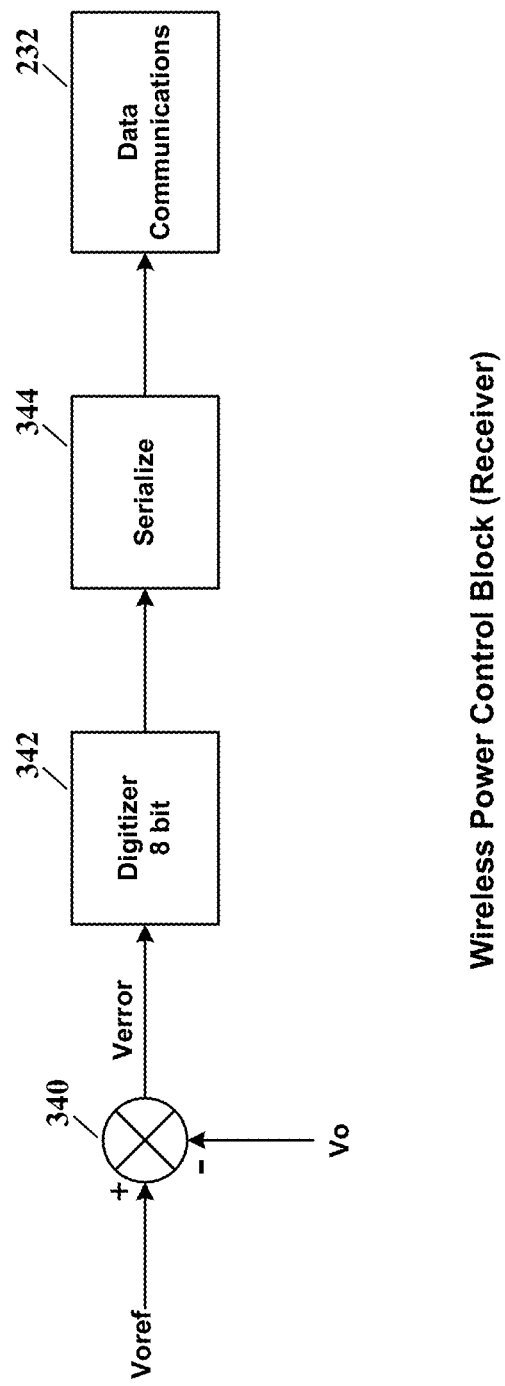
FIG. 3 illustrates a control loop schematic block diagram for a wireless power receiver, according to a specific example embodiment of this disclosure.
Figure 4:
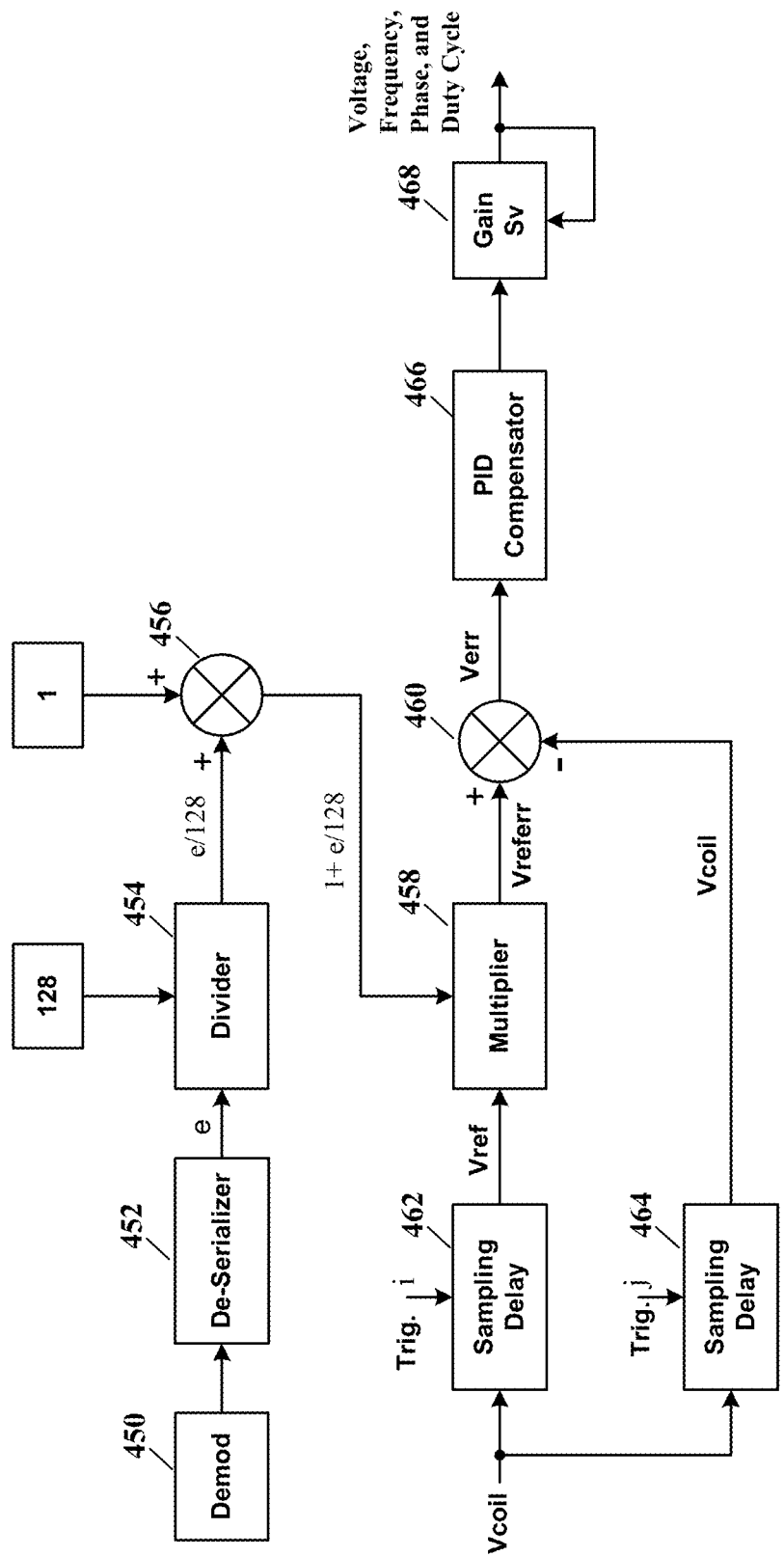
FIG. 4 illustrates a control loop schematic block diagram for a wireless power transmitter, according to a specific example embodiment of this disclosure.

Referring now to FIGS. 3 and 4, depicted are control loop schematic block diagrams for the wireless power receiver 104 and wireless power transmitter 102, respectively, according to specific example embodiments of this disclosure. FIG. 3 shows the control loop schematic block diagram for the wireless power receiver 104. A control voltage difference circuit 340 may subtract a fixed reference voltage, Voref, from the diode bridge 230 output voltage, Vo, to generate an error voltage, Verror. The error voltage, Verror, may be converted into, for example but is not limited to, a signed 8-bit integer number using a digitizer 342. The signed 8-bit integer number may be serialized with a serializer 344 and sent across the coils 110, 112 to the wireless power transmitter 102 with the data modulation circuit 232 that controls either the current drawn by the load 108 or detuning of the receiver tuned circuit 229.

FIG. 4 shows the block diagram of the transmitter control. Data modulation may comprise phase changes in the coil 110 that may be determined from the voltage of the coil 110 converted into digital values by the ADC 236 and sent to the microcontroller 222. The microcontroller 222 may comprise the following: a demodulation circuit 450 for detecting the data modulation sent from the receiver tuned circuit 229 to the coil 110. The demodulation circuit 450 produces a serial data word that is coupled to a de-serializer 452 which de-serializes the serial data word from the demodulator 450 and may form an 8-bit error packet having a value "e." The error packet value e may have values from +127 to −128. The error value e may be divided by 128 in a digital divider 454 and then one (1) may be added thereto by a digital adder 456.

The digitized voltage amplitude of coil 110 provided by the ADC 236 of FIG. 2 may be sampled with a sampling delay 462 at time instants trigger i before the arrival of the error packet, and output as Vref. Vref may then be multiplied, in multiplier 458, with the error value 1+e/128 from digital adder 456 to generate a reference error voltage, Vreferr. The reference error voltage Vreferr may have subtracted from it the actual coil voltage amplitude, Vcoil, measured at time instants trigger j to generate a voltage error, Verr. The value of trigger j can vary from, for example but not limited to, 1 to 20 for every control error packet received. The voltage error, Verr, may be passed through a proportional-integral-derivative (PID) compensator 466 and its output may be scaled by a constant value Sv in gain block 468. The value of Sv may depend on the primary transmitter control parameter(s) such as voltage and frequency, without limitation. The output of the gain block 468 provides a new value of the control variable, which determines required power into the wireless transmitter coil 110 for transmission to the wireless power receiver coil 112.

The voltage on the coil 110 may be rectified with the diode 240 and may be stepped down through voltage divider 234, for example but is not limited to, 3.3 volts. The use of diode 240 only allows the positive part of the voltage waveform produced across coil 110 to be applied to the ADC 236. The voltage waveform at no load has a peak at half the on time. As the load increases, the center shifts to the left (earlier), see FIGS. 5 and 6. The same voltage can be used as reference for the control loop, which preferably is updated based on the feedback received from the receiver.

Two methods will be described for determination of the coil voltage amplitude for control and demodulation, it being understood that other methods are available, and the two methods described are not meant to be limiting. In a first of the two methods, the sampling of the voltage waveform produced across coil 110 may be done using an averaging mode of the ADC 236. The samples are started after a delay from the start of the PWM cycle of H-bridge inverter 220 to allow for settling of transients. The number of samples per period of the PWM cycle may be variable, but 8 samples is preferred. The samples may be spaced apart uniformly over the PWM period. The average of the 8 samples then is available at the end of conversion by ADC 236, which may output an interrupt to the microcontroller 222.

Figure 5:
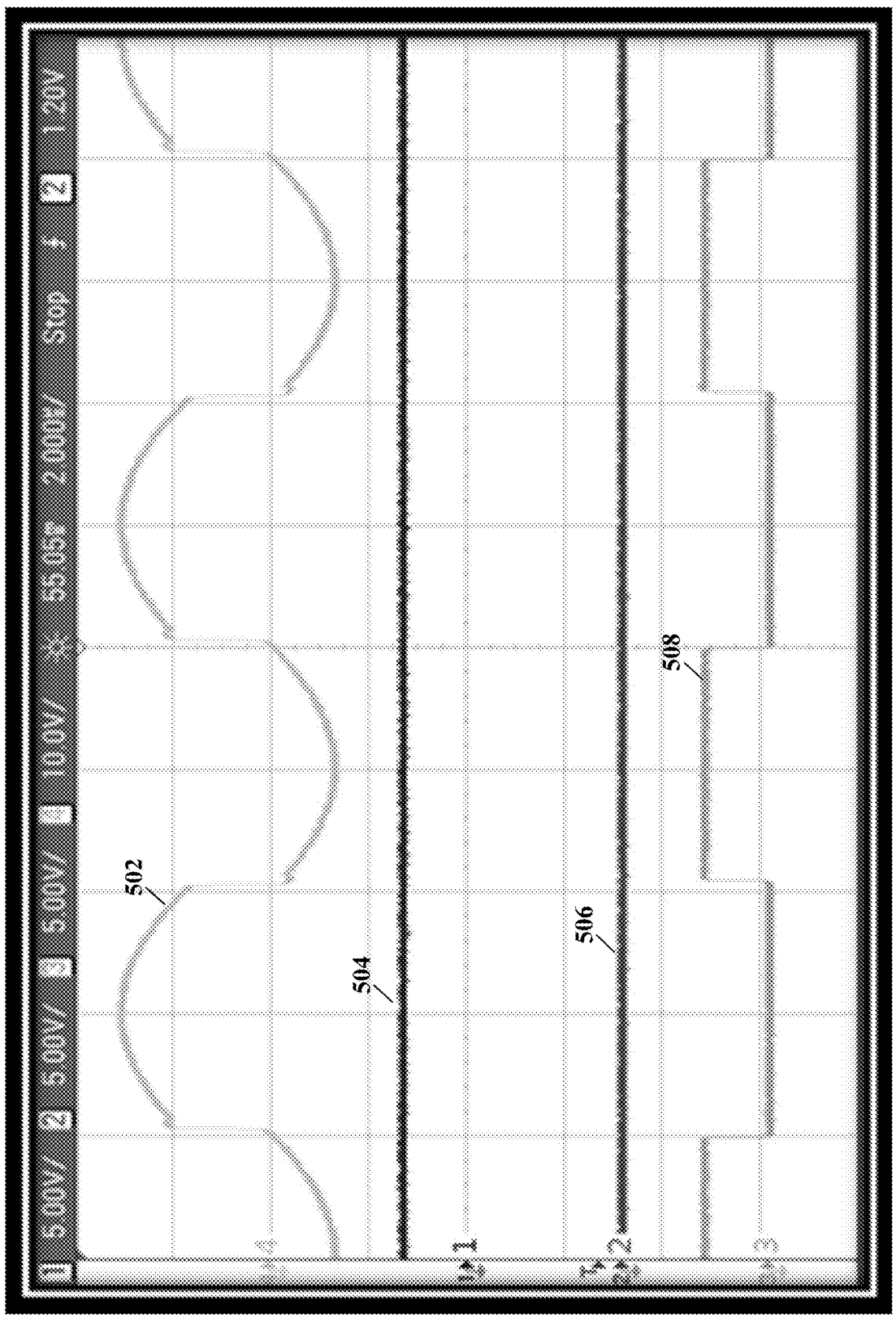
FIGS. 5 and 6 illustrate coil voltage waveforms at no load and full load, respectively; and associated PWM signal, demodulated signal and verified message waveforms resulting therefrom, according to the teachings of this disclosure.
Figure 6:
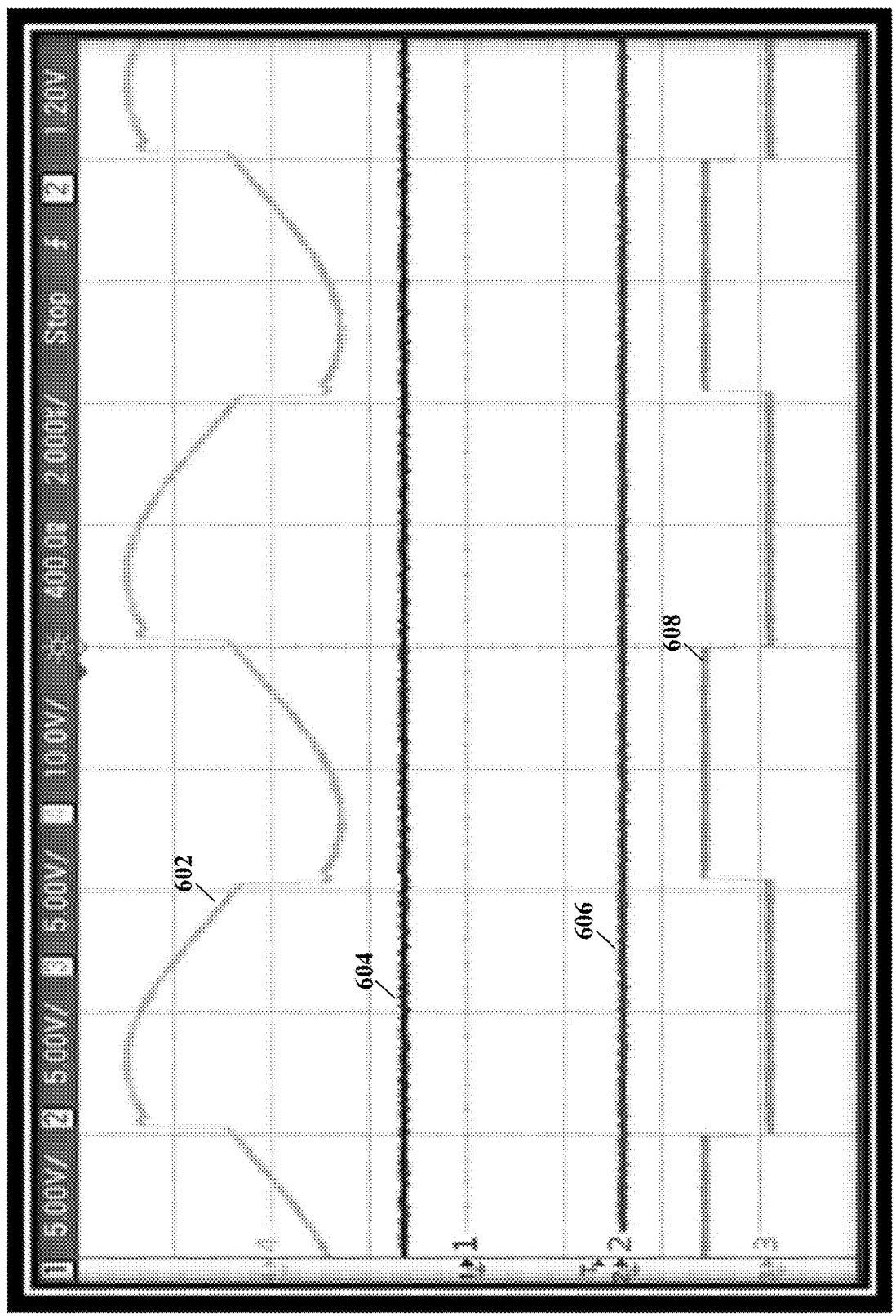

Referring now to FIGS. 5 and 6, depicted are coil voltage waveforms produced across coil 110 at no load and full load, respectively, of wireless power transmitter 102; an associated PWM signal produced by microcontroller 222 for control of H-bride inverter 220, a demodulated signal and verified (e.g., parity checked) message waveforms resulting therefrom, according to the teachings of this disclosure. FIG. 5 shows no load coil voltage waveform 502, demodulated signal 504, verified message 506 and PWM signal 508. FIG. 6 shows full load coil voltage waveform 602, demodulated signal 604, verified message 606 and PWM signal 608.

The coil voltage waveform 502/602 may be rectified with a diode 240 (FIG. 2) and divided down to a range of about 3.3V using a resistor divider 234. This would allow only the positive part of the coil voltage waveform 502/602 to be applied to the ADC 236. The coil voltage waveform 502 at no load has a peak amplitude at the center of the on-time period. As the load increases, the peak amplitude shifts to the left of the center of the on-time period. The same coil voltage waveform 502 voltage can be used as reference for the control loop, which is updated based on the data word received from the wireless power receiver 104.

Figure 7:
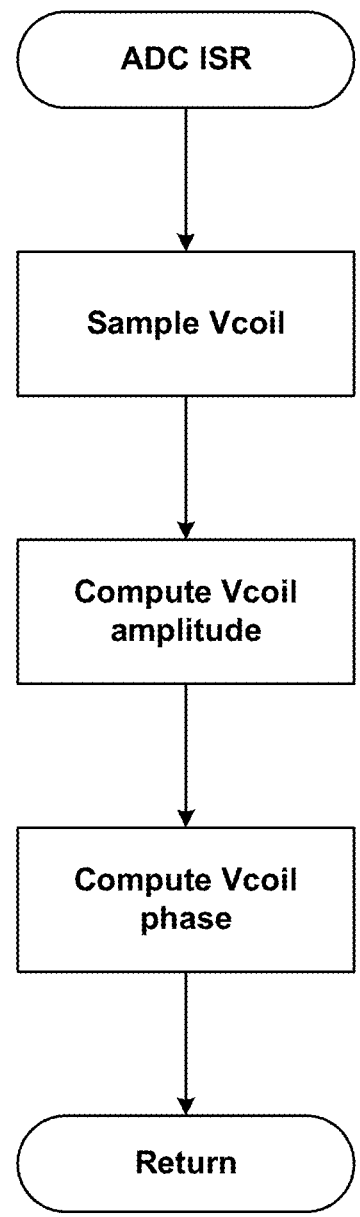
FIG. 7 illustrates a schematic block diagram of an interrupt service routine (ISR) for operation of the wireless power transmitter, according to a specific example embodiment of this disclosure.

Referring now to FIG. 7, depicted is a schematic block diagram of an interrupt service routine (ISR) of microcontroller 222 for operation of the wireless power transmitter, according to a specific example embodiment of this disclosure. An interrupt is processed using an interrupt service routine (ISR). The ISR may comprise reading the average coil voltage value once per sampling period. The ADC value is then processed to compute amplitude and phase of the coil voltage. A 4-point moving average of the voltage amplitude of the coil 110 may be taken and used as a reference for controlling the coil voltage.

The H-bridge inverter 220 may provide a voltage amplitude waveform based on feedback (data error packet) from the wireless power receiver 104. Note that the demodulated transmitter coil 110 voltage waveform may capture responses to two such control error packets. Each packet may initiate 4 iterations (j) to converge to the desired output voltage. If the Verror is large, then multiple error packets may be used to reach the desired output charging voltage at the wireless power receiver 104, i.e., until voltage Voref converges to Vref (FIG. 3).

The demodulation of the signal received from the wireless power receiver 104 may be done on any of the signals: coil voltage, coil current, and/or input current. The coil voltage and coil current have a high frequency component from which the signal from wireless power receiver 104 may be demodulated. However, the input current of wireless power transmitter 102 is typically heavily filtered and closely resembles a DC waveform. The input current is typically used for power calculation and foreign object detection, and thus not preferred demodulation of the signal received from the wireless power receiver 104.

Figure 8:
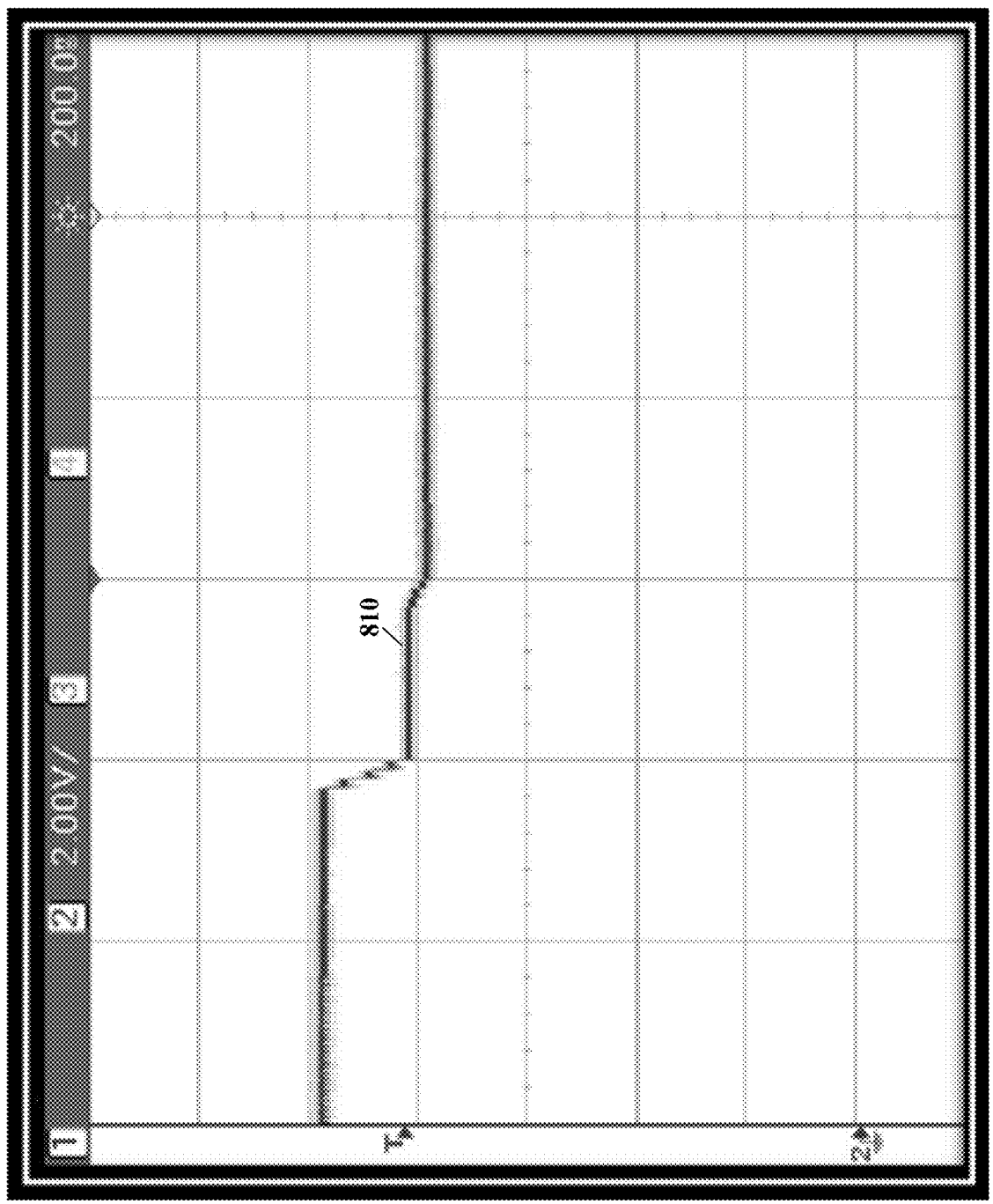
FIG. 8 illustrates a waveform of a control loop action on the wireless power transmitter, according to the teachings of this disclosure.

Referring now to FIG. 8, depicted is a waveform of a control loop action on the wireless power transmitter 102, according to the teachings of this disclosure. The input voltage 106 fed to the H-bridge inverter 220 may be controlled based on feedback from the wireless power receiver 104. Note that the waveform 810 may capture response to two such control error packets. Each packet may initiate four (4) iterations (j) to converge to the output desired output voltage. Thus waveform 810 shows an initial setting, a lower value responsive to the first error packet, and a yet lower value responsive to the second error packet. As indicated above, if the error is large, then multiple error packets may be used to reach the desired output voltage at the wireless power receiver 104.

Figure 9:
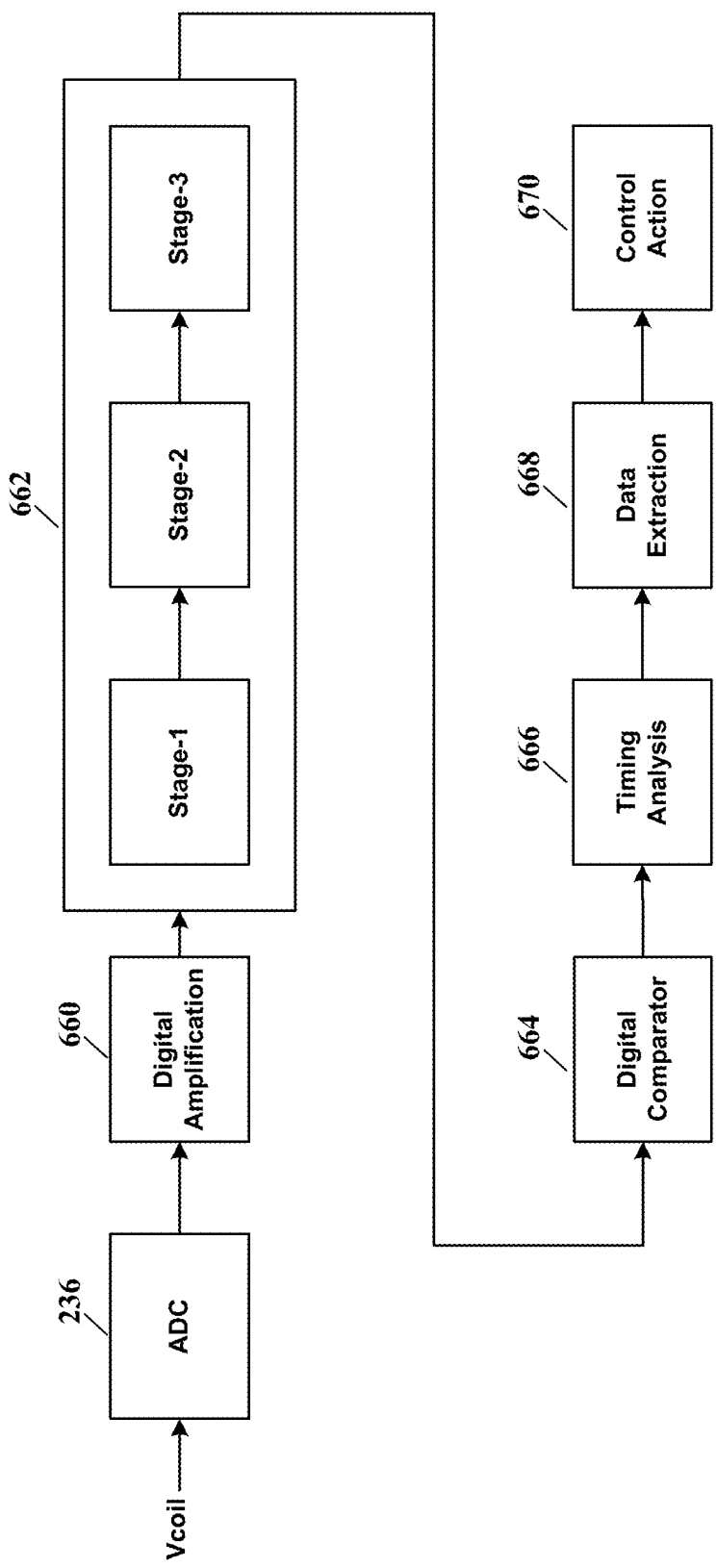
FIG. 9 illustrates a schematic block diagram of a demodulation process of the transmitter coil voltage for serial data error packet extraction, according to a specific example embodiment of this disclosure.

Referring now to FIG. 9, depicted is a schematic block diagram of a demodulation process of the transmitter coil voltage, i.e., the voltage across coil 110, for serial data error packet extraction, according to a specific example embodiment of this disclosure. FIG. 6 shows a way of processing the transmitter coil voltage amplitude, Vcoil, for demodulation of the serial data packet from the wireless power receiver 104. The average voltage value reflects a resolution of the ADC 236 which is typically 12-bits in present technology microcontrollers 222. A unipolar 12-bit value may be processed to remove the dc component (e.g., 1.65V from voltage divider 234) and the resulting digital 12-bit signal may be amplified by 8 with a digital amplifier 660. This results in a 16-bit signed average voltage signal. The processed signal may then be passed through a 3-stage cascaded filter 662 to filter out the high and low frequency components in the processed signal. The high pass section filters out the average component present in the signal due to the half wave rectification (diode 240). The low pass filter may have two sections to effectively filter out the 125 kHz component present in the signal, i.e., the fixed frequency of the wireless transmitter with voltage control. If this filtering is insufficient, then the 125 kHz component appears as ripple in the compensator output. The high pass filter cutoff may be set to 1000 Hz, while the low pass frequency cutoff may be set to 5000 Hz. This configuration provides a bandpass filter effect between 1 to 5 kHz. Since the signal of interest is between 1 to 2 kHz, the output of the compensator provides a demodulated signal.

The 3-stage cascaded filter 662 output is compared against a threshold with hysteresis in a digital comparator 664 to obtain a digital signal with two digital logic levels 0 and 1, e.g., 0 volts and 3.3 volts, respectively. This digital signal is connected to the timing analysis 666 and data extraction 668 modules to verify the timing and extract a 0 or 1 logic level from the demodulated waveform. The received signal may have been encoded in such a way that absence of transition for 500 μs would result in a logic '0', while a 250 μs transition would result in a logic '1'. The Qi message structure consists of several '1's to synchronize the detection, followed by a start bit, 8-bit message, parity, and a stop bit.

The data extraction module 668 extracts the message starting with the start bit, computes checksum and compares the parity to determine if the message is received correctly. If so, a valid data packet is generated, and the packet message is processed for further action based on the message type. There may be several messages passed between the wireless power transmitter 102 and the wireless power receiver 104, the important one being the control error value. As described above in relation to FIG. 3, the wireless power receiver 104 measures the voltage at its end, compares it with a reference voltage, Voref, and sends the error to the wireless power transmitter 102 as an 8-bit signed integer. The control loop operating in the wireless power transmitter 102 shown in FIG. 4, applies the control error to the coil current value (transmitted power) and takes corrective action thereto.

This filter configuration is identical to the one described above and provides a bandpass filter effect between 1 and 5 kHz. Since the signal of interest is between 1 and 2 kHz, the output of the compensator provides a demodulated signal. The subsequent processing of the message is identical to the description given above.

In the second of the two methods, voltage across coil 110 is oversampled within a PWM period by ADC 236. There may be 8 samples taken during the first half of the PWM period. The samples are stored by the microcontroller 222 may use direct memory access (DMA) transfers and may be processed by the microcontroller 222 after 8 samples are collected. From these samples, the peak of the voltage is determined and used in place of the average voltage of the first method for demodulation. The average value may still be used for control.

In another variant, both the average and peak values may be used to measure the voltage across coil 110 and may be passed through parallel paths each as described in relation to FIG. 9. The path which decodes the packet correctly would be used to process the data sent by the receiver.

In another variant, one of the average or peak value may be used for demodulation using the path shown in FIG. 9. The peak value may be set as the default path to start with and may be changed to average value in case the peak value is unable to decode packets correctly.

Figure 10:
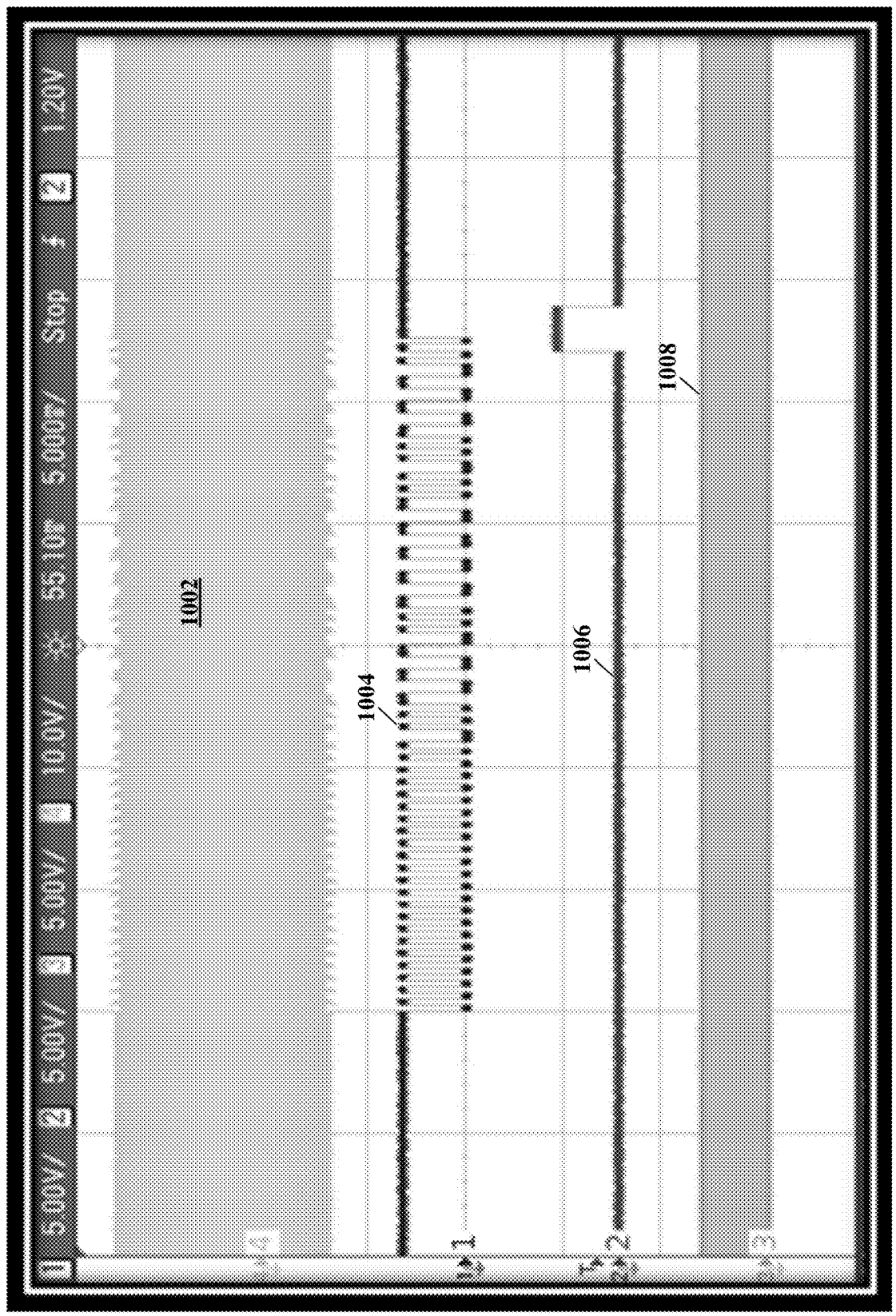
FIG. 10 illustrates demodulation waveforms using coil voltage at no load, according to the teachings of this disclosure.

Referring now to FIG. 10, depicted are demodulation waveforms of the voltage across coil 110 at no load, according to the teachings of this disclosure. FIG. 10 shows the voltage across coil 110 waveform 1002, the demodulated signal 1004, a verified message 1006 and a PWM signal 1008. The modulation on the transmitter coil voltage 1002 may be demodulated to extract the receiver data from the demodulated signal 1004. The data packet may be verified based on the parity and a valid packet may be generated if the parity is valid. The verified message 1006 may be processed for further action based on the message type.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

What is claimed is:

1. A system for wireless power transfer based on transmitter coil voltage sensing, said system comprising:
   a wireless power transmitter comprising
      a DC-to-AC power inverter, wherein an input of the power inverter is adapted for coupling to a DC power source,
      a transmitter tuned circuit comprising a series connected capacitor and a transmitter power coil, wherein the series connected capacitor and transmitter power coil are coupled to an output of the DC-to-AC power inverter,
      a circuit for sampling voltage on the transmitter power coil, whereby amplitude and phase of the voltage are determined; and
   a wireless power receiver comprising
      an AC-to-DC power converter,
      a receiver tuned circuit comprising a receiver power coil and at least one capacitor, wherein the receiver tuned circuit is coupled to an AC input of the AC-to-DC power converter,
      a voltage control circuit coupled to a DC output of the AC-to-DC power converter and providing a DC voltage to a load, and
      a data communications circuit for modulating voltage control data onto the receiver tuned circuit;
   wherein the receiver power coil is inductively coupled to the transmitter power coil, receives power therefrom and transmits modulated voltage control data thereto for controlling the voltage amplitude on the transmitter power coil.

2. The system for wireless power transfer according to claim 1, wherein the data communications circuit modulates the voltage control data onto the receiver tuned circuit by changing current drawn by the load.

3. The system for wireless power transfer according to claim 1, wherein the data communications circuit modulates the voltage control data onto the receiver tuned circuit by changing the receiver tuned circuit resonant frequency.

4. The system for wireless power transfer according to claim 1, wherein the voltage control data is demodulated by comparing the phase of the voltage on the transmitter power coil with a pulse width modulation (PWM) signal from the output of the DC-to-AC power inverter.

5. The system for wireless power transfer according to claim 1, wherein the wireless power transmitter further comprises:
- a positive voltage detector coupled at a node between the series connected capacitor and transmitter power coil and providing a positive voltage therefrom,
- an analog-to-digital converter (ADC) having an analog input coupled to an output of the positive voltage detector, and
- a microcontroller having a digital input coupled to the ADC and an output coupled to and controlling the DC-to-AC power inverter, wherein the microcontroller monitors the positive voltage from the positive voltage detector and controls the AC voltage from the DC-to-AC power inverter, wherein the positive voltage comprises a positive voltage waveform from the DC-to-AC power inverter and the modulated voltage control data from the wireless power receiver.

6. The system for wireless power transfer according to claim 1, wherein the wireless power receiver further comprises:
- a circuit for providing an error value from a comparison between the DC output voltage from the AC-to-DC power converter and a reference voltage;
- an N-bit digitizer for digitizing the error value to a digital error value; and
- a serializer for converting the digital error value into a serial data word and coupling the serial data word to the data communications circuit for transmission as the modulated voltage control data to the wireless power transmitter.

7. The system for wireless power transfer according to claim 6, wherein the demodulation of the voltage control data comprises:
- a de-serializer for converting the serial data work back to the digital error value;
- a digital divider for dividing the digital error value (e) by 128;
- an adder for adding one (1) to e/128;
- a first sampler for sampling the voltage on the transmitter power coil at a delay time instance i to produce a voltage reference, Vref;
- a multiplier for multiplying Vref with 1+e/128 to produce a voltage reference error value, Vreferr;
- a second sampler for sampling the voltage on the transmitter power coil at a delay time instance j to produce a coil voltage, Vcoil;
- a subtractor for subtracting Vcoil from Vreferr to produce an error voltage, Verr; and
- a proportional-integral-derivative (PID) compensator having an input coupled to the subtractor and receiving the error voltage, Verr.

8. The system for wireless power transfer according to claim 7, further comprising a gain block to scale an output of the PID compensator.

9. The system for wireless power transfer according to claim 7, wherein the first sampler takes at least one sample at delay time instance i, wherein i is a positive integer value.

10. The system for wireless power transfer according to claim 9, where i is from 1 to 20 for every voltage control data received.

11. The system for wireless power transfer according to claim 7, wherein the second sampler takes at least one sample at delay time instance j, wherein j is a positive integer value.

12. The system for wireless power transfer according to claim 1, where j is from 1 to 20 for every voltage control data received.

13. The system for wireless power transfer according to claim 9, wherein the voltage reference, Vref, is an average of i samples per voltage control data received.

14. The system for wireless power transfer according to claim 11, wherein the coil voltage, Vcoil, is an average of j samples per voltage control data received.

15. The system for wireless power transfer according to claim 6, wherein N is equal to eight (8).

16. The system for wireless power transfer according to claim 1, wherein the DC-to-AC power inverter is a metal oxide semiconductor field effect transistor (MOSFET) H-bridge inverter.

17. A method for wireless power transfer based on transmitter coil voltage sensing, said method comprising the steps of:
- generating an alternating current (AC) signal from a DC power source and coupling the AC signal to a transmitter tuned circuit comprising a series connected capacitor and a transmitter power coil;
- inductively coupling the AC signal from the transmitter tuned circuit to a receiver tuned circuit comprising a receiver power coil and at least one capacitor;
- generating a DC voltage with an AC-to-DC power converter coupled to the receiver tuned circuit, wherein the receiver tuned circuit is coupled to an AC input of the AC-to-DC power converter;
- supplying DC voltage from the AC-to-DC power converter to a load;
- modulating voltage control data onto the receiver tuned circuit whereby a voltage on the transmitter power coil changes according to the voltage control data modulation;
- sampling the voltage on the transmitter power coil, whereby amplitude and phase of the voltage are determined;
- demodulating the voltage control data from the phase of the sampled voltage on the transmitter power coil; and
- controlling the amplitude of the voltage on the transmitter power coil from the demodulated voltage control data.

18. The method for wireless power transfer according to claim 17, wherein the step of modulating voltage control data onto the receiver tuned circuit comprises the step of changing current drawn by the load with the voltage control data.

19. The method for wireless power transfer according to claim 17, wherein the step of modulating voltage control data onto the receiver tuned circuit comprises the step of changing the receiver tuned circuit resonant frequency with the voltage control data.

20. The method for wireless power transfer according to claim 17, wherein the modulating voltage control data comprises serial digital data.

21. The method for wireless power transfer according to claim 17, wherein the step of demodulating the voltage control data from the phase of the sampled voltage comprises the step of comparing the sampled voltage to a pulse width modulation (PWM) signal of the generated AC signal.

\* \* \* \* \*